(12) United States Patent
Yang et al.

(10) Patent No.: US 11,803,218 B2
(45) Date of Patent: Oct. 31, 2023

(54) OUTPUT STRUCTURE FOR POWER SUPPLY WITH A PLURALITY OF HEAT DISSIPATION PLATES

(71) Applicant: SEA SONIC ELECTRONICS CO., LTD., Taipei (TW)

(72) Inventors: Hung-Wei Yang, Taipei (TW); Chih-Sheng Chang, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 0 days.

(21) Appl. No.: 17/587,100

(22) Filed: Jan. 28, 2022

(65) Prior Publication Data
US 2023/0244286 A1 Aug. 3, 2023

(51) Int. Cl.
*G06F 1/20* (2006.01)
*H05K 7/20* (2006.01)
*G06F 1/18* (2006.01)

(52) U.S. Cl.
CPC .............. *G06F 1/206* (2013.01); *G06F 1/189* (2013.01); *H05K 7/20154* (2013.01)

(58) Field of Classification Search
CPC ....................................................... G06F 1/206
See application file for complete search history.

(56) References Cited

U.S. PATENT DOCUMENTS

| 2010/0177466 | A1* | 7/2010 | Lu | .............. | H05K 7/1457 361/679.01 |
| 2013/0039019 | A1* | 2/2013 | Lu | .............. | H05K 7/06 361/728 |
| 2017/0322607 | A1* | 11/2017 | Kawana | .............. | G06F 1/206 |

FOREIGN PATENT DOCUMENTS

| CN | 209029913 U | * | 6/2019 | |
| CN | 113474744 A | * | 10/2021 | .............. G06F 1/20 |
| CN | 216719633 U | * | 6/2022 | |

* cited by examiner

*Primary Examiner* — Suresh Suryawanshi
(74) *Attorney, Agent, or Firm* — Muncy, Geissler, Olds & Lowe, P.C.

(57) ABSTRACT

The invention provides an output structure for a power supply, comprising a working circuit board, an output circuit board, a plurality of output connectors, a plurality of heat dissipation plates and a plurality of thermistors. The output circuit board is electrically connected with the working circuit board and is provided with at least one temperature sensing circuit, the plurality of output connectors is arranged on the output circuit board, the plurality of heat dissipation plates is arranged on the output circuit board and close to the output connectors, the plurality of heat dissipation plates senses heat of the output circuit board and at least one of the output connectors at the same time, the plurality of thermistors is arranged corresponding to the plurality of heat dissipation plates one to one and is connected with the at least one temperature sensing circuit.

11 Claims, 5 Drawing Sheets

OUTPUT STRUCTURE FOR POWER SUPPLY WITH A PLURALITY OF HEAT DISSIPATION PLATES

FIELD OF THE INVENTION

The present invention relates to an output structure for a power supply, in particular to an output structure for improving a conventional power supply not capable of independently sensing a temperature of a key assembly.

BACKGROUND OF THE INVENTION

Upon investigation, although an existing power supply is provided with a temperature sensing assembly (for example, a thermistor and the like) to sense a temperature of the power supply, the conventional temperature sensing assembly senses a temperature of an internal environment of the power supply actually. That is, the conventional power supply must work for a period of time when being implemented, the temperature of the internal environment of the power supply may be slightly increased only after a large quantity of heat energy produced by an electronic assembly accumulates in the power supply, at this time, the conventional temperature sensing assembly senses rise in the temperature of the power supply, and then a working management module in the power supply starts a corresponding heat dissipation mechanism.

However, the foregoing temperature sensing mode easily leads to the conventional temperature sensing assembly cannot specifically detect the temperatures of assemblies in the power supply, for example, when the power supply outputs a large current, output connectors easily generates high temperature after running for a period of time; whereas at this time, an environment temperature sensed by the temperature sensing assembly is not greatly increased, the working management module still controls a radiator fan to maintain an original rotating speed mode, which enables the output connectors not to obtain effective heat dissipation, and then there is a possibility of burning the output connectors.

SUMMARY OF THE INVENTION

A main objective of the present invention is to solve the problem that a conventional temperature sensing mechanism only sense the internal environment of a power supply and cannot independently sense a key assembly.

To achieve the above objective, the present invention provides an output structure for a power supply, comprising a working circuit board, an output circuit board, a plurality of output connectors, a plurality of heat dissipation plates and a plurality of thermistors. The working circuit board is provided with a working management module. The output circuit board is electrically connected with the working circuit board, and comprises at least one output circuit obtaining power from the working circuit board and at least one temperature sensing circuit electrically connected with the working management module. The plurality of output connectors is provided on the output circuit board and is electrically connected with the at least one output circuit. The plurality of heat dissipation plates is provided on the output circuit board and arranged close to the plurality of output connectors, and the plurality of heat dissipation plates receives heat transferred from the output circuit board and at least one of the plurality of output connectors at the same time. The plurality of thermistors is arranged corresponding to the plurality of heat dissipation plates, respectively, and is electrically connected with the at least one temperature sensing circuit, wherein a resistance value of each of the plurality of thermistors is changed by sensing heat dissipated from one of the plurality of heat dissipation plates corresponded to change a resistance value of the at least one temperature sensing circuit, and the working management module generates difference electrical signals based on changes of the resistance value of the at least one temperature sensing circuit and provides different heat dissipation measures.

In an embodiment, the plurality of heat dissipation plates is perpendicular to the output circuit board and arranged close to a side wall of at least one of the plurality of output connectors.

In an embodiment, each of the plurality of heat dissipation plates is contacted with the side wall of one of the output connectors.

In an embodiment, the power supply comprises a backboard facing the output circuit board, and the backboard is provided with a plurality of openings corresponding to the plurality of output connectors, and the plurality of heat dissipation plates does not penetrate out of the openings.

In an embodiment, a length of each of the plurality of heat dissipation plates is smaller than a distance between the output circuit board and the backboard.

In an embodiment, each of the plurality of heat dissipation plates is provided on the output circuit board in any of following arrangements:
  arrangement 1, each of the plurality of heat dissipation plates is arranged close to only one of the plurality of output connectors; and
  arrangement 2, each of the plurality of heat dissipation plates is arranged close to at least two adjacent output connectors.

In an embodiment, at least one of the plurality of output connectors is provided with a plurality of high-potential connecting pins and a plurality of reference-potential connecting pins, and at least one of the plurality of heat dissipation plates is electrically connected with the plurality of high-potential connecting pins of one of the plurality of output connectors close to the at least one of the plurality of heat dissipation plates.

In an embodiment, at least one of the plurality of heat dissipation plates is electrically connected with one of the at least one output circuit.

In an embodiment, the plurality of thermistors is arranged in parallel in the at least one temperature sensing circuit.

In an embodiment, the output circuit board is provided with a plurality of hole sites for the plurality of heat dissipation plates inserting therein.

Through the foregoing implementation of the present invention, compared with the conventional device, the output structure has the following characteristics that: the plurality of thermistors is used for sensing temperatures of the plurality of output connectors and the output circuit board; and when the power supply outputs the large current for a long time, the plurality of thermistors may change a resistance value of the at least one temperature sensing circuit based on the temperatures of the plurality of heat dissipation plates, and the working management module may employ a heat dissipation measures in real time, so that the plurality of output connectors and the output circuit board are prevented from being damaged as being in an over high temperature for a long time.

DETAILED DESCRIPTION OF THE PREFERRED EMBODIMENTS

Figure 1:
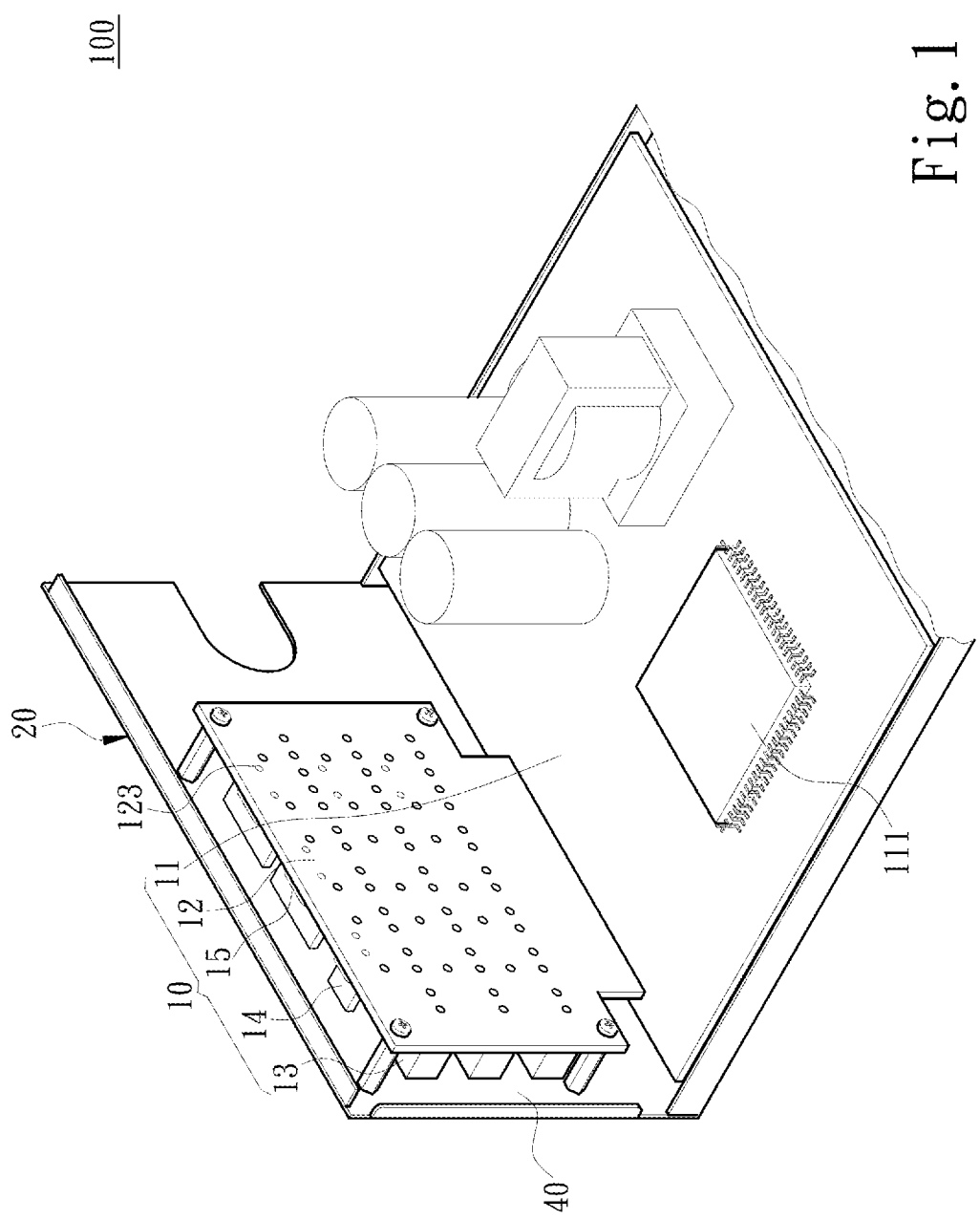
FIG. 1 is a three-dimensional structural schematic diagram according to an embodiment of the present invention.
Figure 2:
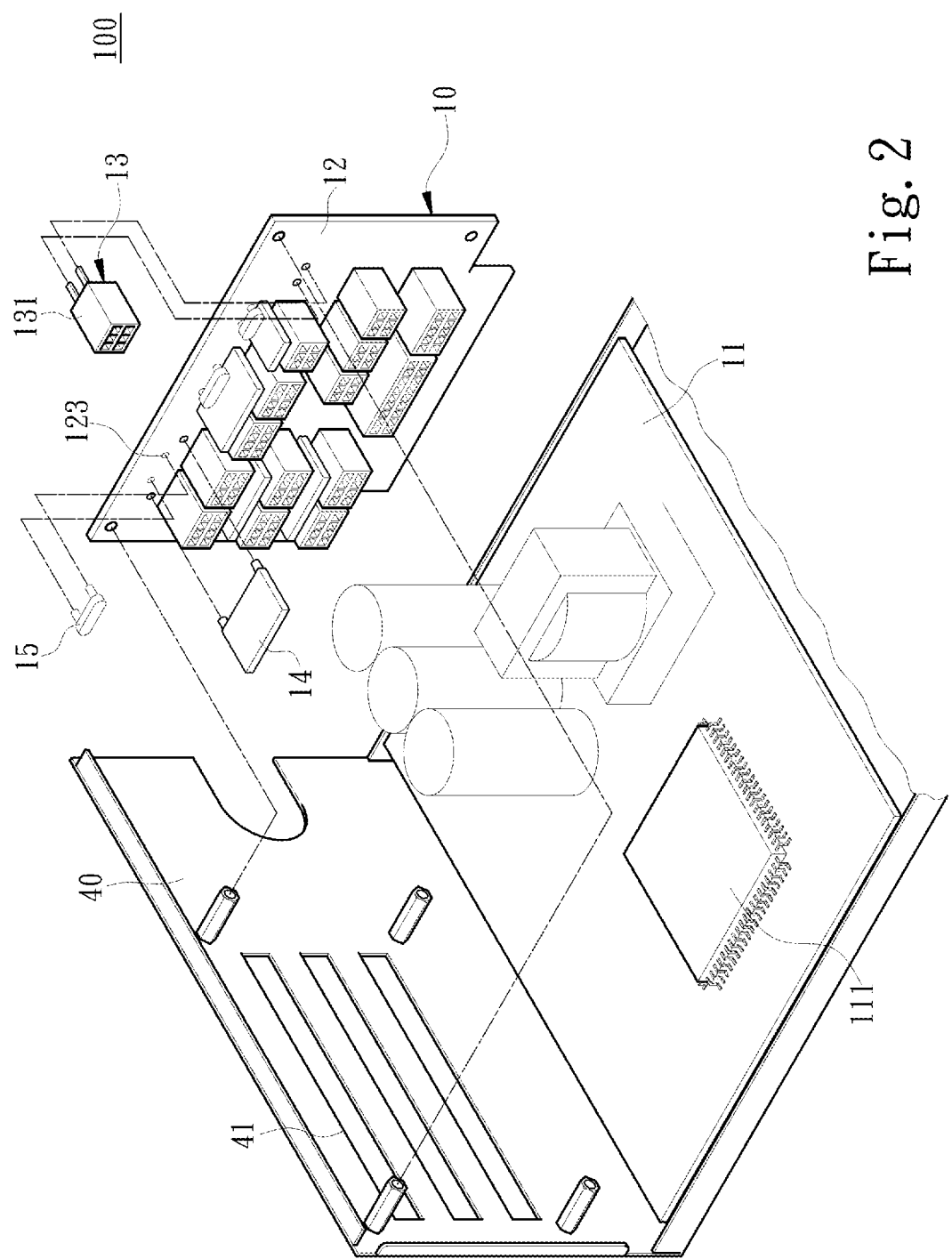
FIG. 2 is an exploded view of assemblies according to an embodiment of the present invention.
Figure 3:
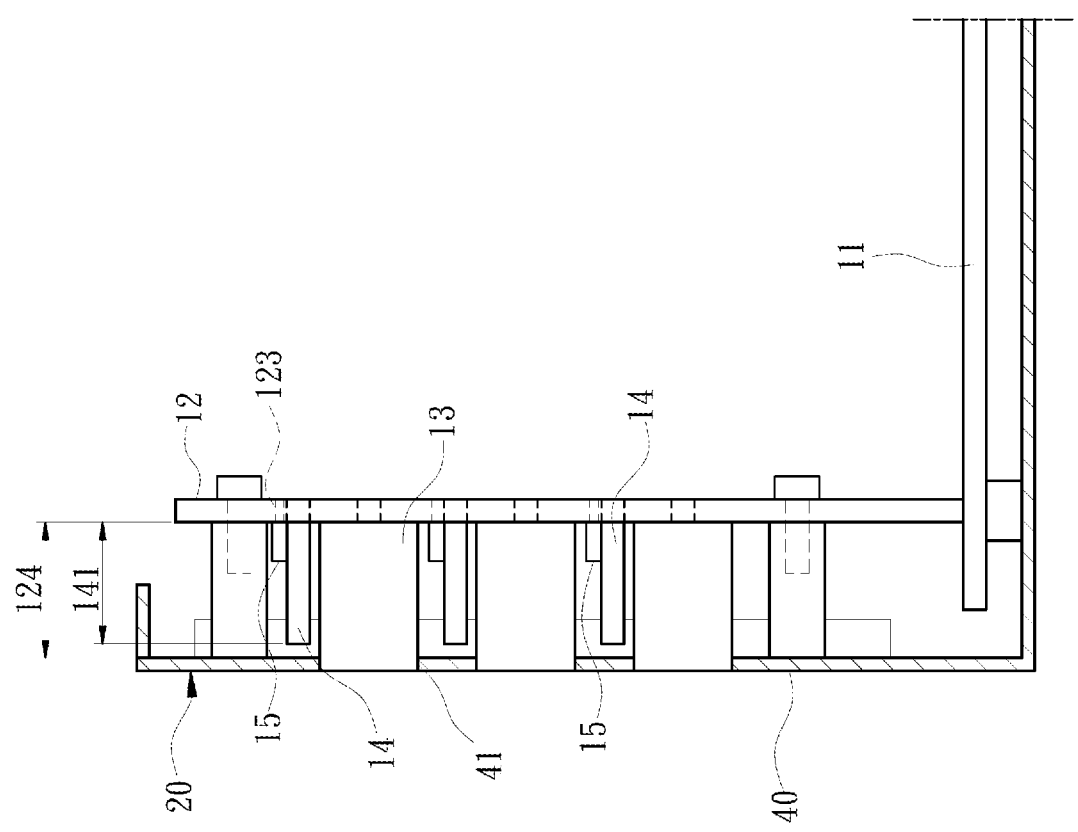
FIG. 3 is a structural schematic diagram according to an embodiment of the present invention.
Figure 4:
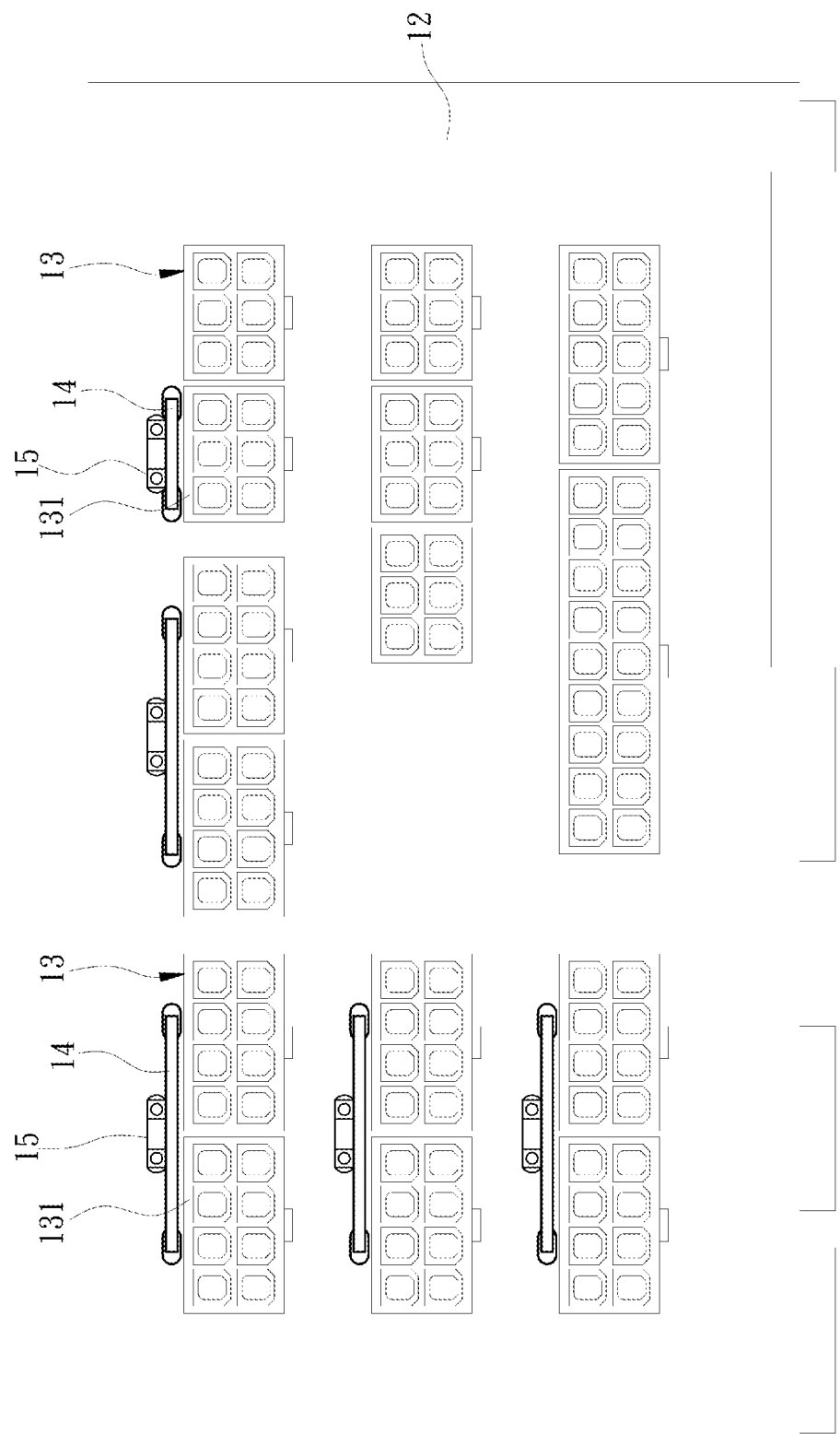
FIG. 4 is a schematic diagram of an output circuit board according to an embodiment of the present invention.
Figure 5:
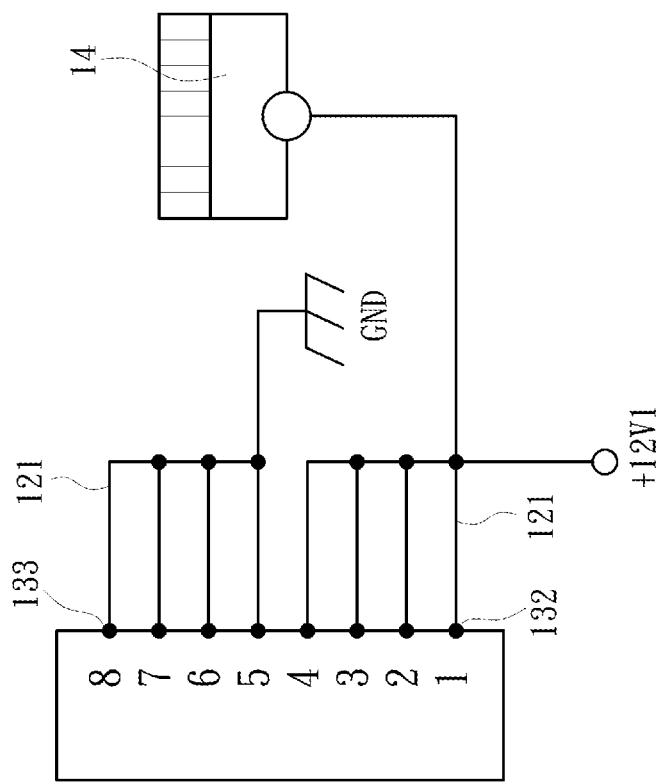
FIG. 5 is a schematic diagram of a circuit board according to an embodiment of the present invention.

The detailed description and the technical content of the present invention are described in cooperation of drawings as follows.

Referring to FIG. 1, FIG. 2, FIG. 3, FIG. 4, FIG. 5 and FIG. 6, the present invention provides an output structure 10. The output structure 10 is arranged on an output terminal 20 of a power supply 100, and comprises a working circuit board 11, an output circuit board 12, a plurality of output connectors 13, a plurality of heat dissipation plates 14 and a plurality of thermistors 15. Specifically, the working circuit board 11 is arranged in the power supply 100 and is provided with a working management module 111 which serves as a control source of the power supply 100. In one embodiment, the working management module 111 is a microcontroller unit (MCU) for controlling other assemblies in the power supply 100 (for example, an inductor, a capacitor, a resistor and the like) to work. The output circuit board 12 is electrically connected with the working circuit board 11, and the plurality of output connectors 13 is provided on the output circuit board 12. The output circuit board 12 comprises a plurality of output circuits 121 and at least one temperature sensing circuit 122. The plurality of output circuits 121 is used to provide the conductive function of the output circuit board 12 to obtain power from the working circuit board 11 and provide the power to the plurality of output connectors 13. The at least one temperature sensing circuit 122 is electrically connected with the working management module 111, so that the working management module 111 is able to generate at least one electrical signal based on the at least one temperature sensing circuit 122.

Figure 6:
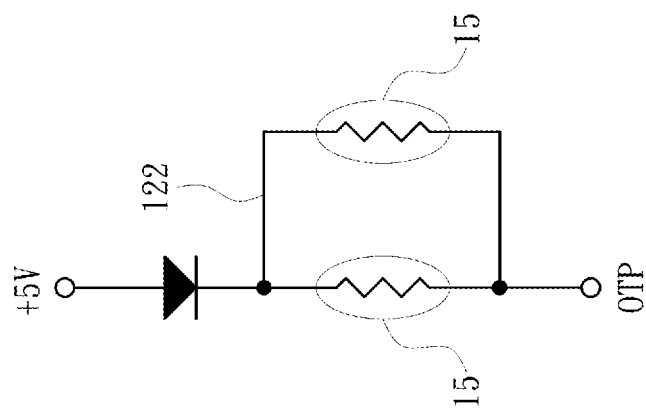
FIG. 6 is a schematic diagram of parallel connection of thermistors according to an embodiment of the present invention.

In addition, the plurality of heat dissipation plates 14 is provided on the output circuit board 12 and is made of a heat-conductive material, for example, a metal plate and the like. The plurality of heat dissipation plates 14 is arranged close to the plurality of output connectors 13, wherein a distance between the plurality of heat dissipation plates 14 and the plurality of output connectors 13 is in a range that the plurality of heat dissipation plates 14 is able to receive the heat radiation of the plurality of output connectors 13, so that the heat dissipated from the output circuit board 12 and at least one of the output connectors 13 is able to be transferred to the plurality of heat dissipation plates 14 at the same time. Further, the plurality of thermistors 15 is arranged corresponding to the plurality of heat dissipation plates 14, respectively, and each of the thermistors 15 is electrically connected with the at least one temperature sensing circuit 122. In an embodiment, the plurality of thermistors 15 is connected in parallel in the at least one temperature sensing circuit 122, as shown in FIG. 6. Each of the plurality of thermistors 15 senses the heat dissipated from one of the heat dissipation plates 14 corresponded.

When temperatures of the output circuit board 12 and one of the plurality of output connectors 13 are increased, at least one of the thermistors 15 corresponding to the output connector 13 is affected by the increased temperature, and a resistance value of the at least one temperature sensing circuit 122 is changed, so that the working management module 111 generates different electrical signals based on the changes of resistances of the at least one temperature sensing circuit 122, and a heat dissipation module (not shown in the drawings) of the power supply 100 is controlled to provide different heat dissipation measures to the output circuit board 12 and the plurality of output connectors 13.

Compared with conventional power supply, when the temperature of the output structure 10 of the present invention is increased, the working management module 111 actives heat dissipation measures based on a change in resistance value of the at least one temperature sensing circuit 122, for example, a rotating speed of a fan of the power supply 100 is increased, so as to reduce a situation that the conventional power supply only takes a temperature of an internal environment as a control basis, which leads to the conventional output connectors or the conventional output circuit board is burnt due to high-temperature work.

Please refer to FIG. 1, FIG. 2, FIG. 3, FIG. 4 and FIG. 5. In an embodiment, the plurality of heat dissipation plates 14 is arranged on the output circuit board 12 by a welding method, or is connected to the output circuit board 12 by an inserting method. For the inserting method, the output circuit board 12 is provided with a plurality of hole sites 123 for the plurality of heat dissipation plates 14 inserting therein, and the plurality of hole sites 123 is arranged at a periphery of at least one of the output connectors 13. Thus, when the plurality of heat dissipation plates 14 is fixed on the output circuit board 12, the plurality of heat dissipation plates 14 is perpendicular to the output circuit board 12, and is arranged close to a side wall 131 of at least one of the output connectors 13. Specifically, in one embodiment, each of the plurality of heat dissipation plates 14 is arranged close to the side wall 131 of only one of the output connectors 13, so that each heat dissipation plate 14 only receives the heat dissipated from the output connector 13 adjacent thereto and the output circuit board 12. In other embodiment, each of the plurality of heat dissipation plates 14 receives the heat dissipated from at least two adjacent output connectors 13 at the same time. Specifically, each of the plurality of heat dissipation plates 14 is arranged close to at least two adjacent output connectors 13, and at least one of the heat dissipation plates 14 is electrically connected with at least one of the output circuits 121. More specifically, at least one of the output connectors 13 is provided with a plurality of high-potential connecting pins 132 and a plurality of reference-potential connecting pins 133. The plurality of reference-potential connecting pins 133 is grounded, and the plurality of high-potential connecting pins 132 has high potentials relative to the reference-potential connecting pins 133, for example, +12V. At least one of the plurality of heat dissipation plates 14 is electrically connected with the plurality of high-potential connecting pins 132 of one of the plurality of output connectors 13 close to the heat dissipation plate 14. In addition to receive the heat dissipated from the output circuit board 12 and the plurality of output connectors 13 corresponded, the plurality of heat dissipation plates 14 further receives currents from the plurality of high-potential connecting pins 132 of the plurality of output connectors 13 to provide a current buffer to the plurality of high-potential connecting pins 132 of the plurality of output connectors 13.

In one embodiment, each of the plurality of heat dissipation plates 14 does not contact with the side wall 131 of one of the output connectors 13, and the plurality of heat dissipation plates 14 receives the heat dissipated from at least one of the output connectors 13 through heat radiation. In other embodiment, each of the heat dissipation plates 14 is designed to be contacted with the side wall 131 of one of the output connectors 13, so that heat energy of the plurality of output connectors 13 is transferred to one of the heat dissipation plates 14 corresponded through heat conduction.

In addition, the power supply 100 of the present invention is provided with a backboard 40 arranged at the output terminal 20 and facing the output circuit board 12. The backboard 40 is provided with a plurality of openings 41 corresponding to the plurality of output connectors 13, and the plurality of openings 41 enables the plurality of output connectors 13 to be exposed out of the surface of the backboard 40. Also, a length 141 of the plurality of heat dissipation plates 14 is smaller than a distance 124 between the output circuit board 12 and the backboard 40. Here, the length 141 is a distance from one end of the plurality of heat dissipation plates 14 facing the output circuit board 12 to the other end of the plurality of heat dissipation plates 14 facing the backboard 40. The plurality of heat dissipation plates 14 is not in contact with the backboard 40 after being assembled on the output circuit board 12. More specifically, the plurality of heat dissipation plates 14 does not penetrate out of the plurality of openings 41 of the backboard 40, and when a user observes from the output terminal 20 of the power supply 100, the plurality of heat dissipation plates 14 does not be exposed out of the surface of the backboard 40.

What is claimed is:

1. An output structure for power supply, comprising:
a working circuit board, provided with a working management module;
an output circuit board, electrically connected with the working circuit board, the output circuit board comprising at least one output circuit obtaining power from the working circuit board, and at least one temperature sensing circuit electrically connected with the working management module;
a plurality of output connectors, provided on the output circuit board and electrically connected with the at least one output circuit;
a plurality of heat dissipation plates, provided on the output circuit board and arranged close to the plurality of output connectors, the plurality of heat dissipation plates receiving heat transferred from the output circuit board and at least one of the plurality of output connectors at the same time; and
a plurality of thermistors, arranged corresponding to the plurality of heat dissipation plates, respectively, the thermistors electrically connected with the at least one temperature sensing circuit, wherein a resistance value of each of the plurality of thermistors is changed by sensing heat dissipated from one of the plurality of heat dissipation plates corresponded to change a resistance value of the at least one temperature sensing circuit, and the working management module generates difference electrical signals based on changes of the resistance value of the at least one temperature sensing circuit and provides different heat dissipation measures.

2. The output structure for the power supply according to claim 1, wherein the plurality of heat dissipation plates is perpendicular to the output circuit board and arranged close to a side wall of at least one of the plurality of output connectors.

3. The output structure for the power supply according to claim 2, wherein each of the plurality of heat dissipation plates is contacted with the side wall of one of the output connectors.

4. The output structure for the power supply according to claim 2, wherein the power supply comprises a backboard facing the output circuit board, and the backboard is provided with a plurality of openings corresponding to the plurality of output connectors, and the plurality of heat dissipation plates does not penetrate out of the openings.

5. The output structure for the power supply according to claim 4, wherein a length of each of the plurality of heat dissipation plates is smaller than a distance between the output circuit board and the backboard.

6. The output structure for the power supply according to claim 1, wherein each of the plurality of heat dissipation plates is provided on the output circuit board in any of following arrangements:
arrangement 1: each of the plurality of heat dissipation plates is arranged close to only one of the plurality of output connectors; and
arrangement 2: each of the plurality of heat dissipation plates is arranged close to at least two adjacent output connectors.

7. The output structure for the power supply according to claim 6, wherein at least one of the plurality of output connectors is provided with a plurality of high-potential connecting pins and a plurality of reference-potential connecting pins, and at least one of the plurality of heat dissipation plates is electrically connected with the plurality of high-potential connecting pins of one of the plurality of output connectors close to the at least one of the plurality of heat dissipation plates.

8. The output structure for the power supply according to claim 1, wherein at least one of the output connectors is provided with the plurality of high-potential connecting pins and the plurality of reference-potential connecting pins, and at least one of the plurality of heat dissipation plates is electrically connected with the plurality of high-potential connecting pins of one of the plurality of output connectors close to the at least one of the plurality of heat dissipation plates.

9. The output structure for the power supply according to claim 1, wherein at least one of the plurality of heat dissipation plates is electrically connected with one of the at least one output circuit.

10. The output structure for the power supply according to claim 1, wherein the plurality of thermistors is arranged in parallel in the at least one temperature sensing circuit.

11. The output structure for the power supply according to claim 1, wherein the output circuit board is provided with a plurality of hole sites for the plurality of heat dissipation plates inserting therein.

* * * * *